United States Patent [19]

Dobkin

[11] 4,153,909
[45] May 8, 1979

[54] GATED COLLECTOR LATERAL TRANSISTOR STRUCTURE AND CIRCUITS USING SAME

[75] Inventor: Robert C. Dobkin, Menlo Park, Calif.

[73] Assignee: National Semiconductor Corporation, Santa Clara, Calif.

[21] Appl. No.: 423,430

[22] Filed: Dec. 10, 1973

[51] Int. Cl.² .......................................... H01L 27/02
[52] U.S. Cl. ....................................... 357/44; 357/35; 357/36; 357/46; 357/92; 307/299 B; 307/303
[58] Field of Search ...... 317/235 WW, 235 Y, 235 Z; 357/35, 36, 44, 46, 92; 307/299 B, 303

[56] References Cited

U.S. PATENT DOCUMENTS

| | | | |
|---|---|---|---|
| 3,562,548 | 2/1971 | Armgarth | 317/235 X |
| 3,579,059 | 5/1971 | Widlar | 317/235 |
| 3,626,313 | 12/1971 | Zuk | 317/235 UX |
| 3,654,530 | 4/1972 | Lloyd | 317/235 R |
| 3,697,785 | 10/1972 | Gilbert | 317/235 R |
| 4,056,810 | 11/1977 | Hart et al. | 357/92 |

OTHER PUBLICATIONS

H. Berger, "Integrated, Separately Switching Current Sources", IBM Tech. Discl. Bull., vol. 14, #5, Oct. 1971, pp. 1422, 1423.

*Primary Examiner*—Joseph E. Clawson, Jr.
*Attorney, Agent, or Firm*—Brown & Martin

[57] ABSTRACT

In a lateral transistor structure, an auxiliary collector is interposed between the emitter and the main collector for controlling the flow of injected current carriers to the main collector. Alternatively, the main collector may be utilized for sensing the state of saturation of the interposed auxiliary collector. One or both of the main and auxiliary collector structures may be segmented to provide various function. In the case where only the auxiliary collector is segmented, the output on the main collector is proportional to the number of auxiliary collector segments biased to allow the injected current to pass to the main collector. Alternatively, a plurality of auxiliary collectors may be interposed in with the injected current series between the emitter and the main collector to provide an output at the main collector only if each and every one of the auxiliary collectors is biased for gating of current therethrough to the main collector. Such a device is particularly useful as an AND gate. An equivalent SCR structure that can be turned off is formed by providing positive feedback from the main collector to the base of the transistor. A saturation controlled transistor is obtained at the auxiliary collector output by providing negative feedback from the main collector to the base.

4 Claims, 14 Drawing Figures

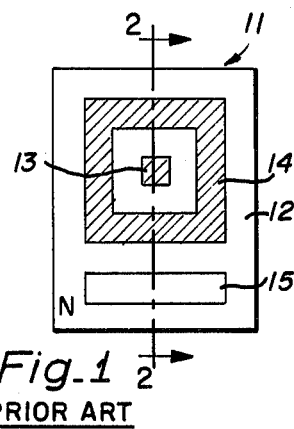
Fig_1
PRIOR ART
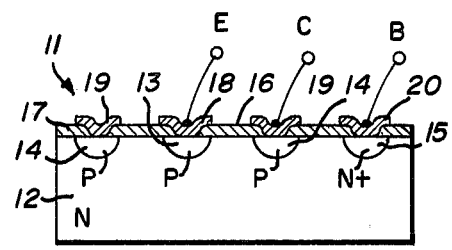
Fig_2
PRIOR ART
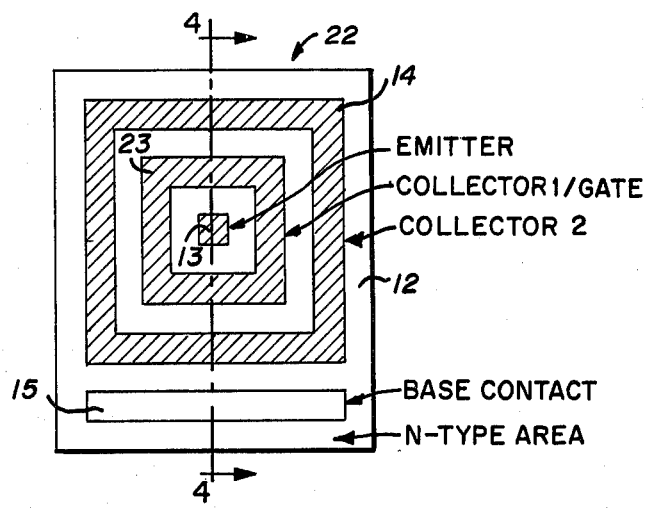
Fig_3
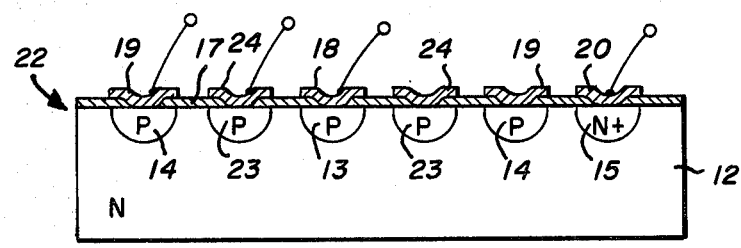
Fig_4
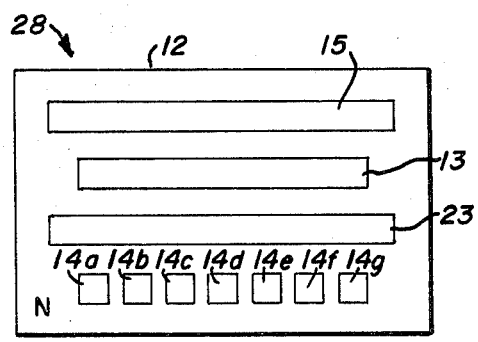
Fig_5
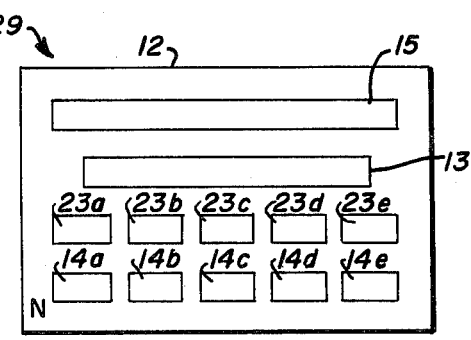
Fig_6

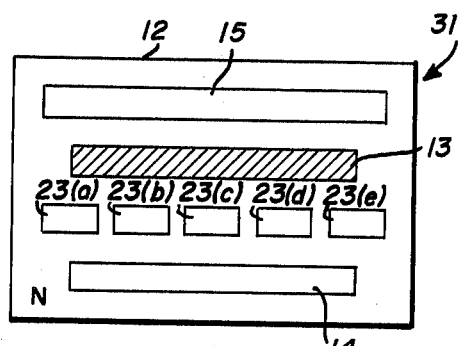
Fig_7
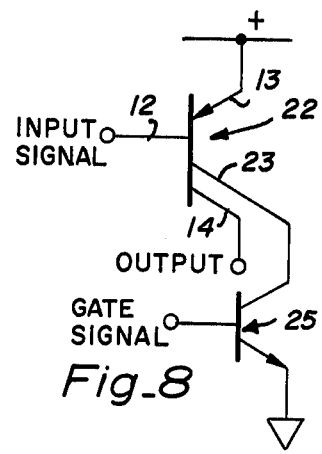
Fig_8
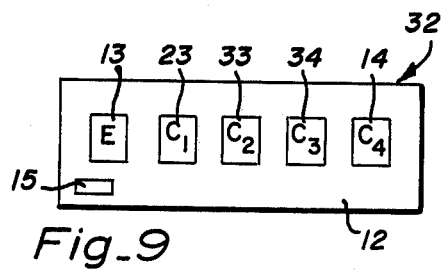
Fig_9
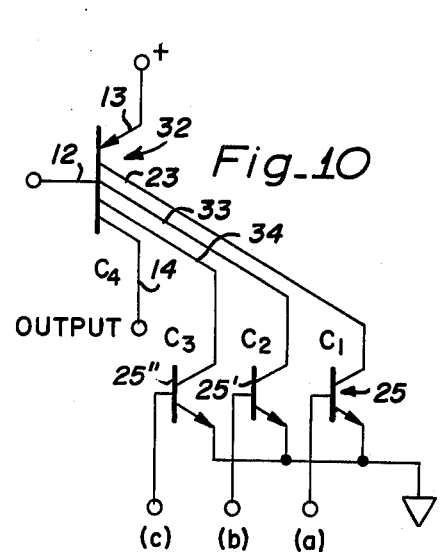
Fig_10
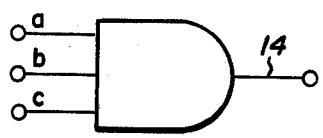
Fig_11
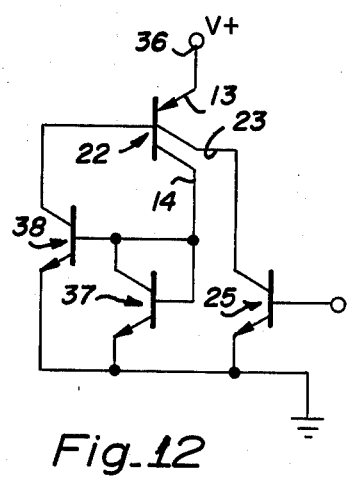
Fig_12
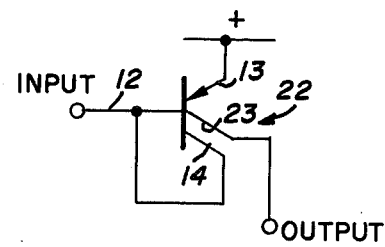
Fig_13

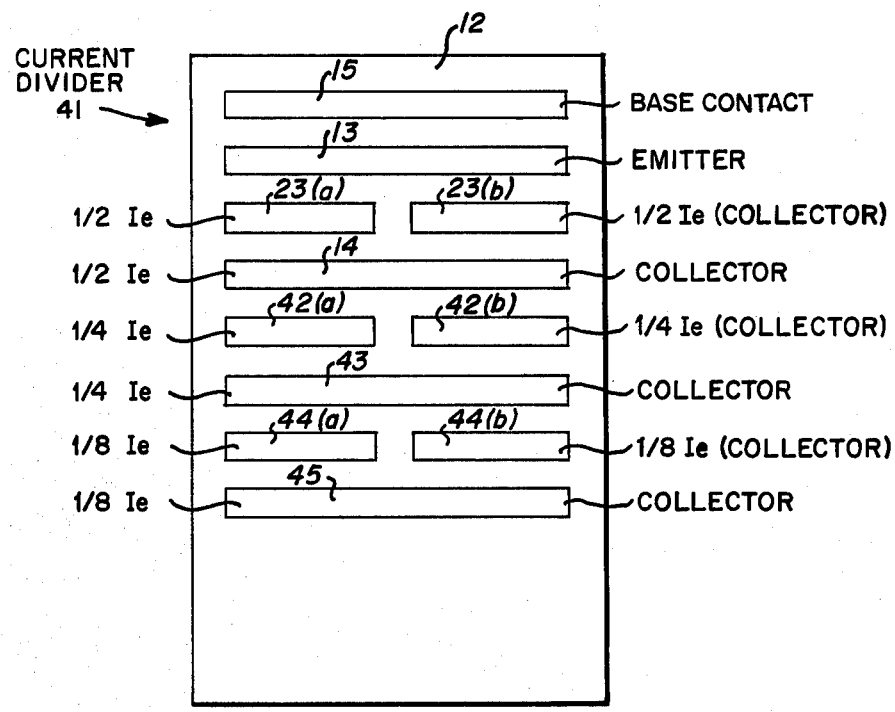
Fig_14

GATED COLLECTOR LATERAL TRANSISTOR STRUCTURE AND CIRCUITS USING SAME

BACKGROUND OF THE INVENTION

The present invention relates in general to lateral transistor structures and more particularly to an improved lateral transistor structure including a gateable collector interposed between the emitter and the main collector of the transistor and to improved circuits using same.

DESCRIPTION OF THE PRIOR ART

Heretofore, multiple collector lateral transistor structures have been proposed wherein a plurality of collector electrodes were disposed around the periphery of an emitter.

SUMMARY OF THE PRESENT INVENTION

The principal object of the present invention is the provision of a lateral transistor structure capable of providing a gating function.

In one feature of the present invention an auxiliary collector is interposed between the emitter and the main collector of a lateral transistor structure, whereby the interposed collector allows a gating function to be performed in a smaller transistor die area with less circuitry than previous circuits would allow.

In another feature of the present invention either or both of the auxiliary and main collectors are segmented to allow additional functions to be performed in a smaller die area and with less circuitry than previous circuits would allow.

In another feature of the present invention, the main and auxiliary collectors of the lateral transistor structure surround the emitter region.

In another feature of the present invention a plurality of auxiliary collector structures are interposed between the emitter and the main collector in the stream of current flow to provide an AND gate function, whereby the current is collected by the main collector only after each of the respective interposed auxiliary collectors are biased to saturation (to a floating potential).

In another feature of the present invention, the interposed auxiliary collector structure is gated "off" and "on" to a source of collector potential for gating "on" and "off", respectively, the flow of injected current to the main collector.

In another feature of the present invention, a positive feedback means is provided from the main collector to the base of the lateral transistor structure and an auxiliary collector is gated "on" and "off" for gating "on" and "off" current to the main collector, whereby an equivalent SCR with a turnoff mode of operation is obtained.

In another feature of the present invention, negative feedback means is provided from the main collector to the base of the transistor structure or another point in a circuit for absorbing base current upon saturation of the auxiliary collector, whereby saturation of the collector is controlled.

In another feature of the present invention a current divider is obtained by segmenting the auxiliary collector structure interposed between the emitter and another collector structure. Caseading of such structures provides a finer degree of division.

Other features and advantages of the present invention will become apparent upon a perusal of the following specifications taken in connection with the accompanying drawings wherein:

BRIEF DESCRIPTION OF THE DRAWINGS

FIG. 1 is a plan view of a prior art lateral transistor structure,

FIG. 2 is a sectional view of the structure of FIG. 1 taken along line 2—2 in the direction of the arrow, FIG. 3 is a view similar to that of FIG. 1 depicting a gateable lateral transistor structure incorporation features of the present invention, FIG. 4 is a sectional view of the structure of FIG. 3 taken along line 4—4 in the direction of the arrows, FIG. 5 is a plan view similar to that of FIG. 3 depicting an alternative embodiment of the present invention, FIG. 6 is a view similar to that of FIG. 5 depicting an alternative embodiment of the present invention, FIG. 7 is a view similar to that of FIG. 6 depicting an alternative embodiment of the present invention, FIG. 8 is a schematic circuit diagram of a gated lateral transistor incorporating features of the present invention, FIG. 9 is a plan view of an alternative lateral transistor structure of the present invention, FIG. 10 is a circuit diagram of an AND gate circuit incorporating the transistor structure of FIG. 9, FIG. 11 is a schematic functional representation of the circuit of FIG. 10, FIG. 12 is a schematic circuit diagram of a gated silicon controlled rectifier circuit incorporating features of the present invention, FIG. 13 is a schematic circuit diagram of a saturation controlled lateral transistor structure incorporating features of the present invention, and FIG. 14 is a plan view of a current divider lateral transistor structure embodying features of the present invention.

DESCRIPTION OF THE PREFERRED EMBODIMENTS

Referring now to FIGS. 1 and 2, there is shown the prior art lateral transistor structure 11. The prior art PNP lateral transistor structure 11 includes an N type base member or body 12 having a P type emitter region 13 formed as by diffusion in the upper surface thereof. A P type collector region 14 is disposed in laterally spaced surrounding relation from the emitter region 13. A N+ base contact diffusion region 15 is disposed on the upper surface of the N type base region 12 for making electrical contact therewith. The base contact region 15 can be placed in any convenient location on the N type wafer 12.

A layer 17 of insulated material such as silicon dioxide is disposed overlaying the upper surface of the lateral transistor structure. Apertures are provided in the insulative layer 17 in registration with the underlying emitter, collector, and base regions 13, 14 and 15, respectively. Metalized electrodes 18, 19 and 20, as of aluminum, are deposited over the apertures in the insulation 17 for making electrical contact to the respective underlaying emitter, collector and base regions of the lateral transistor structure.

The respective electrodes are insulated one from the other by means of the insulative layer 17 such that independent operating DC potentials may be applied to the respective electrodes and thus to the underlying active regions of the transistor structure. Metalization may extend to other circuit elements in the conventional manner of an integrated circuit or bonding leads 21, as shown in FIG. 2, may be bonded to the respective electrode structures.

Referring now to FIGS. 3 and 4, there is shown the gated collector lateral transistor structure 22 of the present invention. The structure of FIGS. 3 and 4 is the same as that previously described with regard to FIGS. 1 and 2 with the exception that art lateral transistor structure 11. The prior art PNP lateral transistor structure 11 includes an N type base member or body 12 having a P type emitter region 13 formed as by diffusion in the upper surface thereof. A P type collector region 14 is disposed in laterally spaced surrounding relation from the emitter region 13. A N+ base contact diffusion region 15 is disposed on the upper surface of the N type base region 12 for making electrical contact therewith. The base contact region 15 can be placed in any convenient location on the N type wafer 12.

A layer 17 of insulated material such as silicon dioxide is disposed overlaying the upper surface of the lateral transistor structure. Apertures are provided in the insulative layer 17 in registration with the underlying emitter, collector, and base regions 13, 14 and 15, respectively. Metalized electrodes 18, 19 and 20, as of aluminum, are deposited over the apertures in the insulation 17 for making electrical contact to the respective underlaying emitter, collector and base regions of the lateral transistor structure.

The respective electrodes are insulated one from the other by means of the insulative layer 17 such that independent operating DC potentials may be applied to the respective electrodes and thus to the underlying active regions of the transistor structure. Metalization may extend to other circuit elements in the conventional manner of an integrated circuit or bonding leads 21, as shown in FIG. 2, may be bonded to the respective electrode structures.

Referring now to FIGS. 3 and 4, there is shown the gated collector lateral transistor structure 22 of the present invention. The structure of FIGS. 3 and 4 is the same as that previously described with regard to FIGS. 1 and 2 with the exception that an auxiliary collector region 23 has been laterally interposed between the emitter 13 and the main collector 14. An annular electrode 24 is disposed in registration with the auxiliary collector 23 and makes electrical contact with the underlying diffusion 23 via an aperture in the insulative layer 17.

The electrode 24 of the auxiliary collector region 23 is insulated from the other electrode structures via the insulative layer 17 to permit independent operating DC potentials to be applied to the auxiliary collector region 23 relative to the potentials applied to the other electrodes including the main collector electrode 19 and its underlying region 14.

The auxiliary collector 23 may be utilized for gating the current injected by the emitter 13 "on" or "off" to the main collector 14. More particularly, if a current collecting potential is applied to the auxiliary collector region 23, the auxiliary collector 23 will collect all current injected by the emitter 13 and no current will be collected by the main collector 14. However, if the gate collector 23 is effectively disconnected from its source of collecting potential and allowed to float as regards the DC potential applied thereto, the current intercepted by the auxiliary or gating collector 23 will be re-emitted by the auxiliary collector 23 and collected by the main collector region 14, assuming a current collecting potential is applied to the main collector 14.

A typical gating circuit utilizing the lateral transistor structure 22 of FIGS. 3 and 4 is shown in FIG. 8. In FIG. 8 the auxiliary of gating collector 23 is connected to a current collecting potential such as ground via the intermediary of a gating transistor 25. In operation, when a gating signal is applied to the base of the gating transistor 25 such as to render the gating transistor 25 conductive, the collecting potential is applied to the gating or auxiliary collector 23 such that the signal current injected by the emitter 13 is collected by the auxiliary collector 23 and no signal current appears at the main collector output 14.

However, when the gating transistor 25 is gated "off" by a suitable potential applied to the base thereof, the d.c. potential of the gating or auxiliary collector 23 is allowed to float. The collector-to-base junction of the auxiliary collector 23 then saturates and re-emits signal current carriers which are collected by the main collector region 14 to produce an output. Thus, in the presence of an input signal applied to the base of gateable lateral transistor 22, this input signal is gated "on" and "off" as received at the main collector 14 via the gate signal applied to the input of the gating transistor 25.

Referring now to FIG. 5, there is shown a multiple output PNP lateral transistor 28 having a gate function. More particularly, the lateral transistor structure 28 is substantially the same as that of circuit 22 previously described with regard to FIG. 3 and 4 with the exception that the lateral transistor configuration is rectilinear as opposed to circular and the main collector 14 has been segmented into a plurality of electrically isolated collector portions 14 (a-g). Thus, the structure of FIG. 5 is like the prior art multiple collector structure except for the provision of the auxiliary of gate collector 23 for gating "on" and "off" the emitter injected current to the respective multiple collectors 14 (a)-14 (g).

Referring now to FIG. 6, there is shown an alternative gated lateral transistor structure 29 is similar to transistor structure 28, previously described with regard to FIG. 5, with the exception that the auxiliary collector structure 23 has also been segmented into segments 23(a)-23(e). Each respective gate segment is laterally interposed between the emitter and a corresponding respective output collector segment 14(a)-14(e). Each of the respective gate segments 23(a)-23(e) may be selectively gated "on" or "off" for selectively gating injected current to the respective main collector segments 14(a)-14(e). More particularly, the current collected by output collector segment 14(a) may be gated "on" and "off" by gating "on" and "off" the corresponding auxiliary or gating collector segment 23(a) and so forth.

Referring now to FIG. 7, there is shown an alternative gated lateral transistor structure 31 incorporating features of the present invention. The lateral transistor structure 31 is substantially the same as transistor 29 previously described with regard to FIG. 6 with the exception that the output collector 14 is unsegmented. In this manner, the output current collected on the main collector 14 is proportional to the number of gates 23(a)-23(e) that have been gated "off", i.e. are saturated and operating at floating DC potential so that they re-emit to the output collector 14.

Referring now to FIGS. 9-11, there is shown an alternative lateral transistor structure 32 of the present invention. Lateral transistor structure 32 is similar to that previously described with regard to FIGS. 3, 4 and 8 with the exception that additional auxiliary gateable collector 33 and 34 are interposed along with auxiliary collector 23 in the region between the emitter 13 and the main collector 14. The auxiliary 23, 33 and 34 are spaced apart in the direction of current flow from the emitter 13 to the main collector 14.

The gateable auxiliary collectors 23, 33 and 34 operate in the same manner as previously described with regard to auxiliary collector 23. More particularly, when auxiliary collector 23 is gated for collection of the current injected by emitter 13, no current is collected on the downstream auxiliary and main collectors 33, 34 and 14, respectively. When the upstream auxiliary collector 23 is gated for saturation (floating DC potential) the auxiliary collector region 23 re-emits the injected carriers for collection by the next downstream auxiliary collector 33. If auxiliary collector 33 is biased before collection of the injected current, no current flows to the downstream auxiliary and main collectors 34 and 14, respectively. However, if auxiliary collector 33 is biased for floating potential the auxiliary collector region 33 saturates and re-emits the current for collection by the next downstream collector 34 and so forth.

An AND gate circuit utilizing the lateral gated transistor structure 32 of FIG. 9 is shown in FIG. 10. The auxiliary collectors 23, 33 and 34 are connected to a source of collecting potential, such as ground, via gating transistors 25, 25' and 25" in the same manner as previously described with regard to FIG. 8. When the gateable lateral transistor structure 32 is biased for emission of carriers to the collector structure and each of the input terminals (a), (b), and (c) of the respective gating transistors 25-25" are biased such as to render each of the transistors 25-25" non-conductive, the respective auxiliary collectors 23, 33 and 34 will be saturated at a floating DC potential such that they will re-emit the collected current to the main collector 14 to produce an output. The output at the main collector region 14 is the conventional AND function output since the injected current is collected at the main collector region 14 only if all of the auxiliary collectors are saturated. The conventional AND gate function generator is shown in FIG. 11 for the circuit of FIG. 10.

Referring now to FIG. 12, there is shown an electrical circuit employing the gated transistor 22 to produce a gated SCR device. More particularly, a load resistor 36 is provided between the source of positive potential and the emitter 13 of the gated transistor 22. A load transistor 37, connected as a diode, is connected between the main collector 14 of the gateable transistor 22 and the source of collecting potential, namely ground. The potential dropped across the diode connected transistor 37 is applied to the base of a second transistor 38 which is connected between the base of gateable transistor 22 and ground for supplying the base drive current to the gated transistor 22. In this manner, positive feedback is applied from the main collector 14 to the base of the gated transistor 22. A trigger input is applied to the base of transistor 38 for gating "on" the SCR by applying positive feedback to the base of transistor 22.

In operation, high current supplied to the load 36 by turning "off" transistor 25 via a gate control signal and triggering "on" feedback transistor 38 such that the current collected by the main collector 14 provides positive feedback to the base of transistor 22 for driving transistor 22 to saturation in a fully "on" or conductive state for supplying full current to the load resistor 36.

The SCR transistor circuit is turned "off" by gating "on" transistor 25 which serves to gate "off" the current to the main collector 14, thereby stopping the positive feedback and thus turning "off" the base drive to transistor 22 which in turn shuts off the current through the load 36.

Referring now to FIG. 13, there is shown a saturation control transistor circuit wherein the main collector 14 is connected to the base 12 and the auxiliary or gate 23 is connected to an output load not shown. When the condition of the output load changes such that the auxiliary collector 23 tends to approach saturation, injected current will begin to be collected by the main collector 14. The main collector is connected by a negative feedback path to the base input of the gated transistor 22. The negative feedback current to the base drive serves to decrease the injected current to the auxiliary collector 23 thereby preventing it from reaching a condition of saturation. Thus, in the circuit of FIG. 13, the main collector 14 serves as a means for sensing saturation of the auxiliary collector 23.

Referring now to FIG. 14 there is shown a current divider type lateral transistor device 41 of the present invention. The structure is similar to that of FIG. 7 except that the first auxiliary gate collector structure 23 is segmented into only two segments 23 (a) and 23 (b). The first main collector 14 is operated at a floating potential (saturated) for reemitting the collected current and serving to spread out the reemitted current along the length of the collector 14. A second auxiliary collector 42 which is segmented into two half length segments 42 (a) and 42 (b), is interposed between the floating collector 14 and a second full length floating collector 43. Similarly, a third auxiliary collector, which is segmented into two half length segments 44 (a) and 44 (b), is interposed between the second full length floating collector 43 and a full length main collector 45 operating at current collecting potential. Likewise the second halves 23 (a), 42(a), and 44(a) of each of the segmented auxiliary collector structures 23, 42, and 44 are operated at floating potential (saturated).

In this manner, the emitted current $I_e$ is divided among the current collecting electrodes 23(b), 42(b), and 44(b) according to the relation $\frac{1}{2} I_e$, $\frac{1}{4} I_e$, and $\frac{1}{8} I_e$, respectively.

The advantage to the gateable lateral transistor structure of the present invention employing an interposed auxiliary collector between the emitter and the main collector is that this interposed collector allows a gate function to be performed in a smaller die area and with less circuitry than previous circuits would allow. The lateral gateable transistor structures of the present invention are readily fabricated by conventional lateral transistor technology. Although the structures shown in the drawings are PNP lateral transistors, the present invention is equally applicable to NPN structures. NPN structures are readily derived by merely substituting N type conductivity regions for the P type conductivity regions and P type conductivity regions for the N type conductivity regions in the structures depicted in the drawings and thus far described herein.

What is claimed is:
1. In a lateral transistor structure:
   a semiconductive body having emitter means, base means and collector means, said emitter means being disposed for injecting electrical current carriers into said semiconductive body, said collector means being laterally disposed of said emitter means for collecting said injected carriers, said base means being laterally interposed between said emitter and collector means for controlling the flow of injected carriers between said emitter and collector means;

said collector means including, first and second collector portions laterally spaced apart across an intervening portion of said base means, said first collector portion being interposed between said emitter means and said second collector portion for controlling the flow of interjected carriers from said emitter means to said second collector portion;

means for electrically insulating said first collector portion from said second collector portion for DC potential to permit independent DC operating potentials to be established thereon; and wherein said collector means includes at least a third collector portion interposed between said first collector portion and said second collector portion for controlling the flow of injected carriers between said first collector portion and said second collector portion, and means for electrically insulating said third collector portion from said first and second collector portions to permit an independent operating DC electrical potential to be applied to said third collector portion relative to the operating potentials applied to said first and second collector portions; and wherein at least one of said collector portion is segmented into a plurality of independently operable electrode portions.

2. The apparatus of claim 1 wherein a plurality of said first, second, and third collector portions are segmented into a plurality of independently operable electrode portions.

3. The apparatus of claim 1 including means for electrically insulating said collector segments from each other for operation at independent DC electrical potentials.

4. The apparatus of claim 3 including means for electrically insulating said collector segments from each other for operation at independent DC electrical potentials.

* * * * *